(12) United States Patent
Kawasoe (10) Patent No.: US 10,310,579 B2
(45) Date of Patent: Jun. 4, 2019

(54) SEMICONDUCTOR INTEGRATED CIRCUIT AND POWER SUPPLY SWITCHING METHOD

(71) Applicant: LAPIS Semiconductor Co., Ltd., Yokohama (JP)

(72) Inventor: Suguru Kawasoe, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 147 days.

(21) Appl. No.: 15/635,213

(22) Filed: Jun. 28, 2017

(65) Prior Publication Data

US 2017/0371389 A1 Dec. 28, 2017

(30) Foreign Application Priority Data

Jun. 28, 2016 (JP) ................................. 2016-127736

(51) Int. Cl.
*G06F 1/32* (2019.01)
*G06F 1/26* (2006.01)
*G06F 1/14* (2006.01)
*G06F 1/28* (2006.01)
*G11C 5/14* (2006.01)

(52) U.S. Cl.
CPC ............... *G06F 1/266* (2013.01); *G06F 1/14* (2013.01); *G06F 1/28* (2013.01); *G11C 5/147* (2013.01); *G11C 5/143* (2013.01)

(58) Field of Classification Search
CPC .................................................. G06F 1/3287
See application file for complete search history.

(56) References Cited

U.S. PATENT DOCUMENTS

2009/0309549 A1* 12/2009 Shih ..................... G01R 31/362
                                                         320/136
2012/0261994 A1* 10/2012 Nikolov .................... G06F 1/30
                                                         307/66
2015/0355662 A1* 12/2015 Myers ................. G06F 17/5068
                                                         323/311

FOREIGN PATENT DOCUMENTS

JP         2004133800          4/2004

* cited by examiner

*Primary Examiner* — Albert Wang
(74) *Attorney, Agent, or Firm* — JCIPRNET (57) ABSTRACT

A semiconductor integrated circuit capable of efficiently suppressing power consumption when a power supply voltage is lowered is provided. The semiconductor integrated circuit includes: a regulator transforming an external power supply voltage to generate an internal power supply voltage; a processor circuit capable of operating by receiving the internal power supply voltage; a real time clock (RTC) circuit generating current time data by receiving the internal power supply voltage; a supply line supplying the internal power supply voltage to the RTC circuit and to the processor circuit; a changeover switch provided between the supply line and the processor circuit and switching between a connection state and a non-connection state between the supply line and the processor circuit; and a power supply level detection circuit detecting a voltage level of the external power supply voltage, and controlling the changeover switch so as to achieve the non-connection state between the supply line and the processor circuit if detecting that the voltage level is equal to or lower than a predetermined threshold.

5 Claims, 5 Drawing Sheets

SEMICONDUCTOR INTEGRATED CIRCUIT AND POWER SUPPLY SWITCHING METHOD

CROSS-REFERENCE TO RELATED APPLICATION

This application claims the priority benefit of Japan Application no. 2016-127736, filed on Jun. 28, 2016. The entirety of the above-mentioned patent application is hereby incorporated by reference herein and made a part of this specification.

BACKGROUND OF THE INVENTION

Technical Field

The present invention relates to a semiconductor integrated circuit and a power supply switching method.

Related Art

In a semiconductor integrated circuit that constitutes a microcontroller unit (MCU) or the like, a power supply voltage (external power supply voltage) supplied from the outside is stepped down to generate an internal power supply voltage, and the internal power supply voltage is supplied to a processor circuit such as a flash memory, a random access memory (RAM) and a central processing unit (CPU), or a real time clock (RTC) circuit. Examples of such semiconductor integrated circuit include a semiconductor integrated circuit provided with two step-down power supply circuits including one for active use and one for standby use, and capable of switching the step-down power supply circuit that is to operate, depending on whether to set the processor circuit to an active state or to a standby state (e.g., see Japanese Patent Application Laid-Open No. 2004-133800).

SUMMARY OF THE INVENTION

In cases where a voltage level of the external power supply voltage is considerably lowered, to suppress power consumption, it is desired that operation of the flash memory, the RAM and the CPU is stopped. On the other hand, operation of the RTC circuit still needs to be continued in such cases. However, in the above prior-art semiconductor integrated circuit, when the step-down power supply circuit is switched from for active use to for standby use, the power supply voltage is supplied not only to the RTC circuit but also to the processor circuit such as the flash memory, the RAM and the CPU. Accordingly, there is a problem that power consumption cannot be sufficiently reduced.

To solve the above problem, the present invention aims to provide a semiconductor integrated circuit capable of efficiently suppressing power consumption when the power supply voltage is low.

A semiconductor integrated circuit according to the present invention is characterized by including: a regulator transforming an external power supply voltage to generate an internal power supply voltage; a processor circuit capable of operating a supply of the internal power supply voltage; a real time clock (RTC) circuit receiving the internal power supply voltage to generate a current time data; a supply line supplying the internal power supply voltage to the RTC circuit and to the processor circuit; a changeover switch provided between the supply line and the processor circuit and switching between a connection state and a non-connection state between the supply line and the processor circuit; and a power supply level detection circuit detecting a voltage level of the external power supply voltage, and controlling the changeover switch to achieve the non-connection state between the supply line and the processor circuit if detecting that the voltage level is equal to or lower than a predetermined threshold.

In addition, a semiconductor integrated circuit according to the present invention is characterized by including: a first regulator transforming an external power supply voltage to generate a first internal power supply voltage; a second regulator transforming the external power supply voltage to generate a second internal power supply voltage; a processor circuit capable of operating by a supply of the first internal power supply voltage; an RTC circuit receiving the first internal power supply voltage and the second internal power supply voltage to generate current time data; a first supply line supplying the first internal power supply voltage to the processor circuit; a second supply line supplying the second internal power supply voltage to the RTC circuit; a changeover switch provided between the first supply line and the second supply line and switching between a connection state and a non-connection state between the first supply line and the second supply line; and a power supply level detection circuit detecting a voltage level of the external power supply voltage, and stopping operation of the first regulator and controlling the changeover switch to achieve the non-connection state between the first supply line and the second supply line if detecting that the voltage level is equal to or lower than a predetermined threshold.

In addition, a power supply switching method according to the present invention is in a semiconductor integrated circuit including: a regulator transforming an external power supply voltage to generate an internal power supply voltage; a processor circuit capable of operating by a supply of the internal power supply voltage; an RTC circuit receiving the internal power supply voltage to generate a current time data; a supply line supplying the internal power supply voltage to the RTC circuit and to the processor circuit; and a changeover switch provided between the supply line and the processor circuit and switching between a connection state and a non-connection state between the supply line and the processor circuit, and the power supply switching method is characterized by including a step of detecting a voltage level of the external power supply voltage, and a step of controlling the changeover switch to achieve the non-connection state between the supply line and the processor circuit if detecting that the voltage level is equal to or lower than a predetermined threshold.

According to the present invention, in the semiconductor integrated circuit having the RTC circuit, it becomes possible to efficiently suppress power consumption when the power supply voltage is low.

DESCRIPTION OF THE EMBODIMENTS

Hereinafter, examples of the present invention are explained in detail with reference to the drawings. Moreover, in the following explanations regarding the examples and the accompany drawings, substantially the same or equivalent parts are denoted by the same reference numerals.

Embodiment 1

Figure 1:
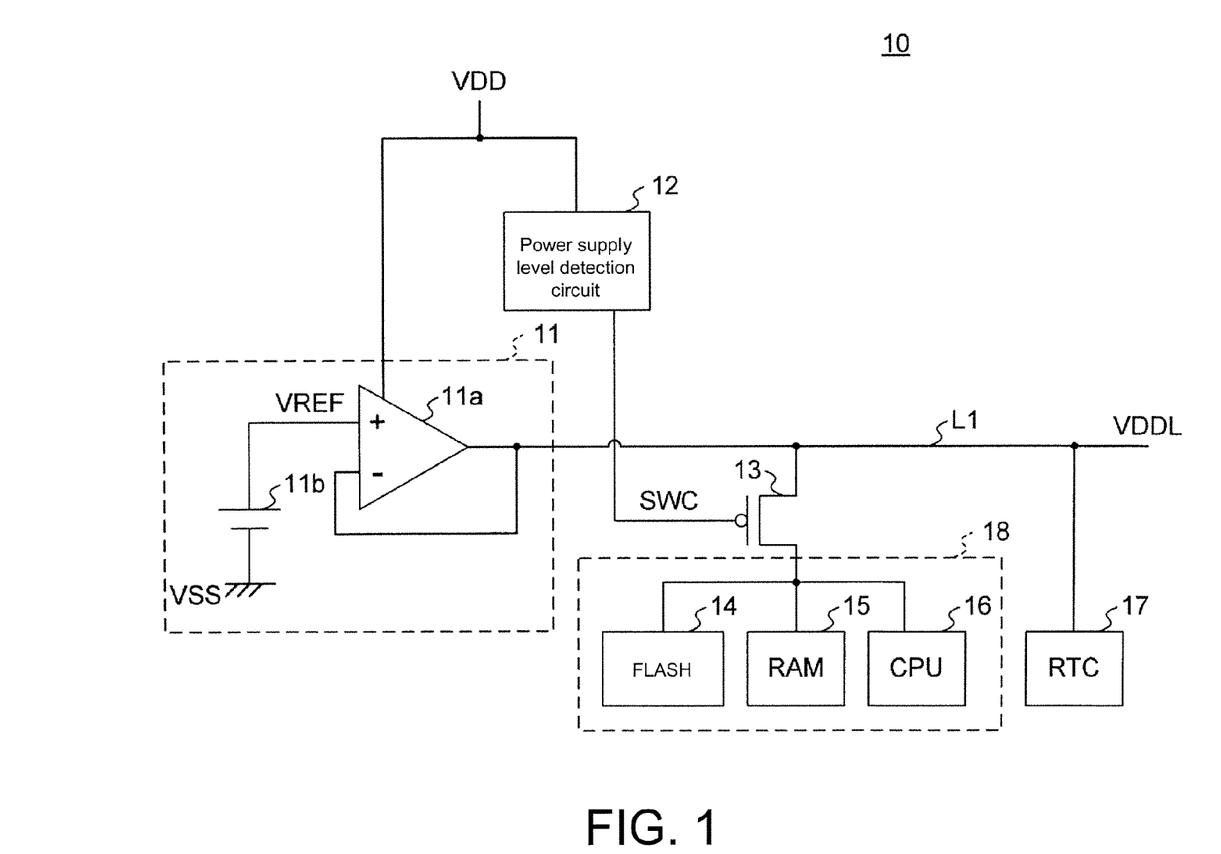
FIG. 1 is a block diagram showing a configuration of a semiconductor integrated circuit according to Example 1.

FIG. 1 is a block diagram showing a configuration of a semiconductor integrated circuit 10. The semiconductor integrated circuit 10 is, for example, an integrated circuit constituting a microcontroller unit (MCU) in which a computer system is incorporated in one circuit. The semiconductor integrated circuit 10 includes a regulator 11, a power supply level detection circuit 12, a changeover switch 13, a flash memory 14, a random access memory (RAM) 15, a central processing unit (CPU) 16 and a real time clock (RTC) circuit 17. In the following explanations, the flash memory 14, the RAM 15 and the CPU 16 are also collectively referred to as a processor circuit 18.

The regulator 11 includes a negative-feedback connected operational amplifier (op-amp) 11a, and a voltage source 11b generating a reference voltage VREF and supplying the same to a non-inverting input terminal of the op-amp 11a. The regulator 11 steps down an external power supply voltage VDD to generate an internal power supply voltage VDDL, and transmits the internal power supply voltage VDDL onto a line L1.

The power supply level detection circuit 12 detects a voltage level of the external power supply voltage VDD. When detecting that the voltage level is lowered to be equal to or lower than a predetermined threshold voltage VTH (i.e., the external power supply voltage VDD is equal to or lower than the threshold voltage VTH), the power supply level detection circuit 12 supplies a switching signal SWC to the changeover switch 13. The switching signal SWC is a signal having a signal level transitioning to binary values of high level ('H') and low level ('L').

The changeover switch 13 includes a P-channel type (first conductivity type) metal-oxide-semiconductor (MOS) transistor. According to the signal level of the switching signal SWC supplied to a gate of the P-channel type MOS transistor, the changeover switch 13 is controlled to be in an ON state and an OFF state so as to switch between connection and non-connection between the line L1 and the processor circuit 18 (the flash memory 14, the RAM 15 and the CPU 16).

The flash memory 14 is a nonvolatile semiconductor memory and operates by receiving the internal power supply voltage VDDL. Similarly, the RAM 15 and the CPU 16 operate by receiving the internal power supply voltage VDDL. Accordingly, if the changeover switch 13 becomes in the OFF state and the connection with the line L1 is disconnected, each of the flash memory 14, the RAM 15 and the CPU 16 stops its operation.

The RTC circuit 17 operates by receiving the internal power supply voltage VDDL, and generates current time data that indicates a current time.

Next, operation of the semiconductor integrated circuit 10 of the present embodiment is explained.

If the external power supply voltage VDD exceeds the threshold voltage VTH (i.e., VDD>VTH), the power supply level detection circuit 12 supplies a low-level switching signal SWC to the changeover switch 13. The changeover switch 13 is controlled to be in the ON state, and the line L1 and the processor circuit 18 are maintained in the connected state. The regulator 11 steps down the external power supply voltage VDD to generate the internal power supply voltage VDDL, and supplies the internal power supply voltage VDDL to the processor circuit 18 (the flash memory 14, the RAM 15 and the CPU 16) and the RTC circuit 17 through the line L1.

Next, if the external power supply voltage VDD becomes equal to or less than the threshold voltage VTH (i.e., VDD≤VTH), the power supply level detection circuit 12 detects this and supplies a high-level switching signal SWC to the changeover switch 13. The changeover switch 13 is controlled to be in the OFF state, and the line L1 and the processor circuit 18 are disconnected. Accordingly, the internal power supply voltage VDDL generated by the regulator 11 is not supplied to the processor circuit 18 (the flash memory 14, the RAM 15 and the CPU 16). On the other hand, the internal power supply voltage VDDL continues to be supplied to the RTC circuit 17.

As described above, in the semiconductor integrated circuit 10 of the present embodiment, when it is detected that the external power supply voltage VDD becomes equal to or less than the threshold voltage VTH, the supply of the internal power supply voltage VDDL to the processor circuit 18 (the flash memory 14, the RAM 15 and the CPU 16) is stopped, and the internal power supply voltage VDDL is only supplied to the RTC circuit 17. Accordingly, it is possible to suppress power consumption while causing the RTC circuit 17 to operate.

Embodiment 2

Figure 2:
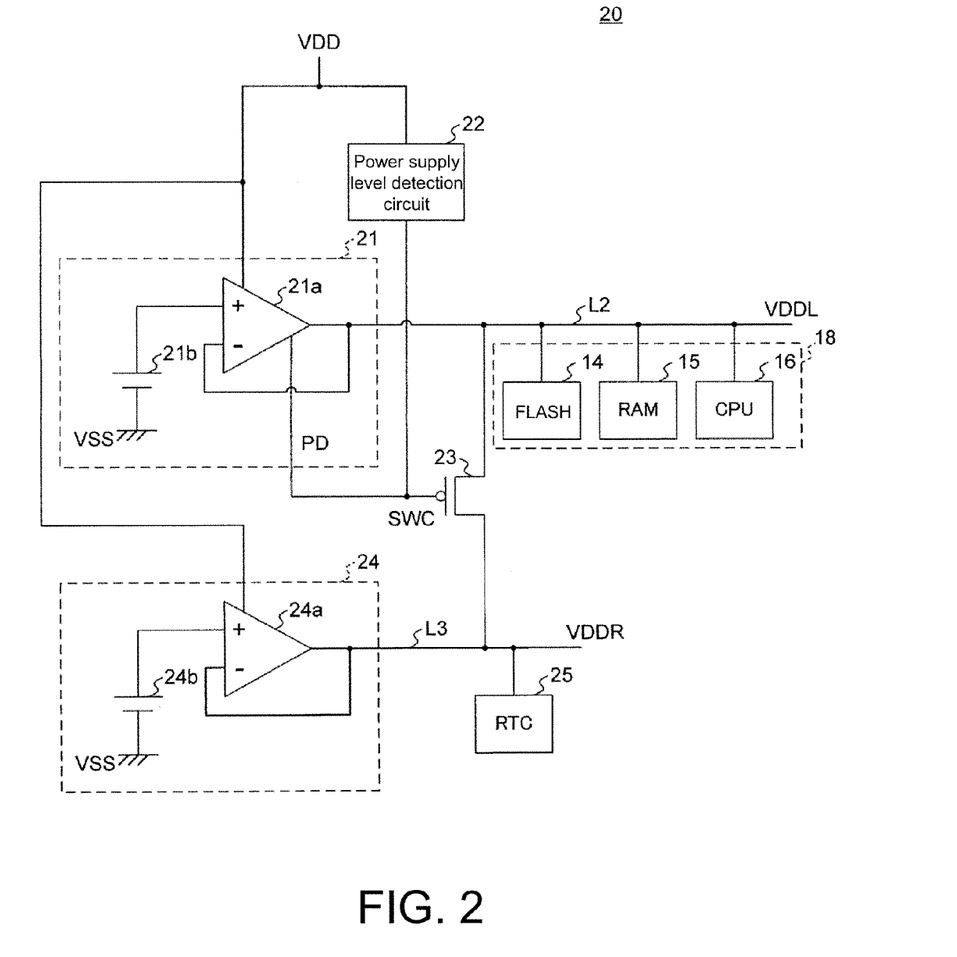
FIG. 2 is a block diagram showing a configuration of a semiconductor integrated circuit according to Example 2.

FIG. 2 is a block diagram showing a configuration of a semiconductor integrated circuit 20. The semiconductor integrated circuit 20 includes a first regulator 21, a power supply level detection circuit 22, a changeover switch 23, a second regulator 24, the processor circuit 18 (including the flash memory 14, the RAM 15 and the CPU 16), and an RTC circuit 25.

The first regulator 21 includes a negative-feedback connected op-amp 21a, and a voltage source 21b generating the reference voltage VREF and supplying the same to a non-inverting input terminal of the op-amp 21a. The first regulator 21 steps down the external power supply voltage VDD to generate the internal power supply voltage VDDL, and supplies the internal power supply voltage VDDL to the processor circuit 18 (the flash memory 14, the RAM 15 and the CPU 16) through a line L2.

In addition, according to a power-down signal PD supplied from the power supply level detection circuit 22, the first regulator 21 is controlled to be in a power-on state and a power-off state. When controlled to be in the power-off state, the first regulator 21 stops the supply of the internal power supply voltage VDDL to the processor circuit 18 (the flash memory 14, the RAM 15 and the CPU 16) through the line L2.

The power supply level detection circuit 22 detects the voltage level of the external power supply voltage VDD. When detecting that the voltage level is lowered to become equal to or lower than the predetermined threshold voltage VTH (i.e., the external power supply voltage VDD is equal to or lower than the threshold voltage VTH), the power supply level detection circuit 22 supplies the switching signal SWC to the changeover switch 23. The switching signal SWC is a signal having a signal level transitioning to binary values of high level ('H') and low level ('L').

In addition, when detecting that the voltage level of the external power supply voltage VDD becomes equal to or lower than the threshold voltage VTH, the power supply level detection circuit 22 supplies, as the power-down signal PD, the same signal as the switching signal SWC, to the op-amp 21a of the first regulator 21.

The power-off control of the first regulator 21 by the supply of the power-down signal PD is, for example, performed by cutting off a current path in the op-amp 21a.

Figure 3:
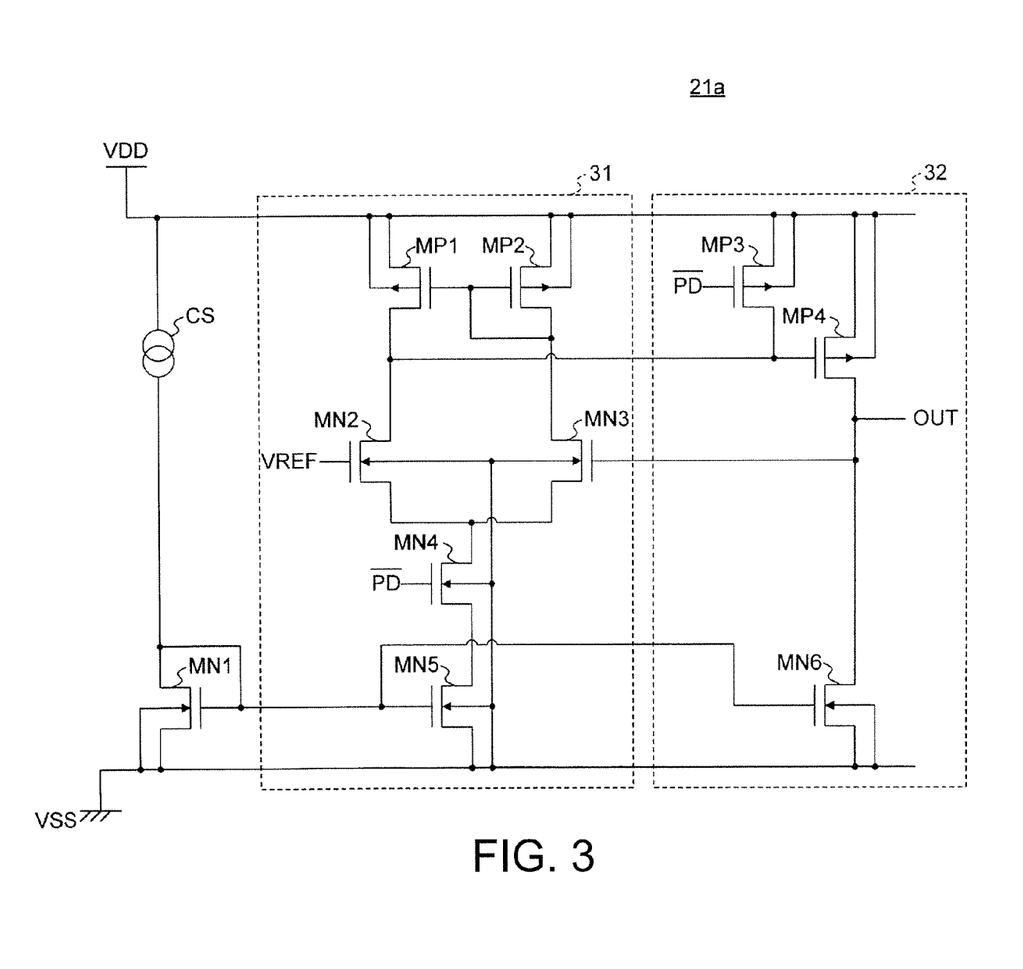
FIG. 3 is a circuit diagram showing a configuration of an operational amplifier (op-amp).

FIG. 3 schematically illustrates an internal configuration of the op-amp 21a. The op-amp 21a includes a differential input section 31 and an output section 32. The differential input section 31 includes a differential pair composed of N-channel type MOS transistors MN2 and MN3, a current mirror composed of P-channel type MOS transistors MP1 and MP2, an N-channel type MOS transistor MN4 and an N-channel type MOS transistor MN5. The output section 32 includes a P-channel type MOS transistor MP3, a P-channel type MOS transistor MP4 and an N-channel type MOS transistor MN6. The N-channel type MOS transistor MN5 constitutes a current mirror with an N-channel type MOS transistor MN1, so as to supply a current proportional to a constant current generated by a constant current source CS to the differential input section 31. In addition, the N-channel type MOS transistor MN6 also constitutes a current mirror with the N-channel type MOS transistor MN1, so as to supply a current proportional to the constant current generated by the constant current source CS to the output section 32.

A signal having a phase opposite to that of the power-down signal PD is supplied to a gate of the N-channel type MOS transistor MN4. Similarly, a signal having a phase opposite to that of the power-down signal PD is supplied to a gate of the P-channel type MOS transistor MP3. The signal having a phase opposite to that of the power-down signal PD is, for example, generated by inverting the power-down signal PD by an inverting amplifier circuit (not illustrated).

If a signal level of the power-down signal PD is a low level, a high-level signal is supplied to the gate of the N-channel type MOS transistor MN4 and the gate of the P-channel type MOS transistor MP3. Accordingly, the N-channel type MOS transistor MN4 becomes in an ON state, and a current flows through the differential input section 31. In addition, the P-channel type MOS transistor MP3 becomes in an OFF state, and a current flows through the output section 32.

On the other hand, if the signal level of the power-down signal PD is a high level, a low-level signal is supplied to the gate of the N-channel type MOS transistor MN4 and the gate of the P-channel type MOS transistor MP3. Accordingly, the N-channel type MOS transistor MN4 becomes in an OFF state, and a state in which no current flows through the differential input section 31 (i.e., a state in which the current path is cut off) is achieved. In addition, since the P-channel type MOS transistor MP3 becomes in an ON state, and a high-level voltage is applied to a gate of the P-channel type MOS transistor MP4, a state in which no current flows through the output section 32 (i.e., a state in which the current path is cut off) is achieved.

Referring again to FIG. 2, the changeover switch 23 includes a P-channel type (first conductivity type) MOS transistor. According to the signal level of the switching signal SWC supplied to a gate of the P-channel type MOS transistor, the changeover switch 23 is controlled to be in an ON state and an OFF state so as to switch to be connected/disconnected between the line L2 and a line L3.

The second regulator 24 includes a negative-feedback connected op-amp 24a, and a voltage source 24b generating the reference voltage VREF and supplying the same to a non-inverting input terminal of the op-amp 24a. The second regulator 24 steps down the external power supply voltage VDD to generate an RTC power supply voltage VDDR, and transmits the RTC power supply voltage VDDR onto the line L3. The second regulator 24 has lower driving capability than the first regulator 21. Accordingly, the RTC power supply voltage VDDR has a lower voltage level than the internal power supply voltage VDDL.

The RTC circuit 25 receives the internal power supply voltage VDDL and the RTC power supply voltage VDDR. If the changeover switch 23 is in the ON state, the RTC circuit 25 operates based on the internal power supply voltage VDDL and generates the current time data that indicates the current time. On the other hand, if the changeover switch 23 is in the OFF state, the RTC circuit 25 operates based on the RTC power supply voltage VDDR and generates the current time data.

Figure 4:
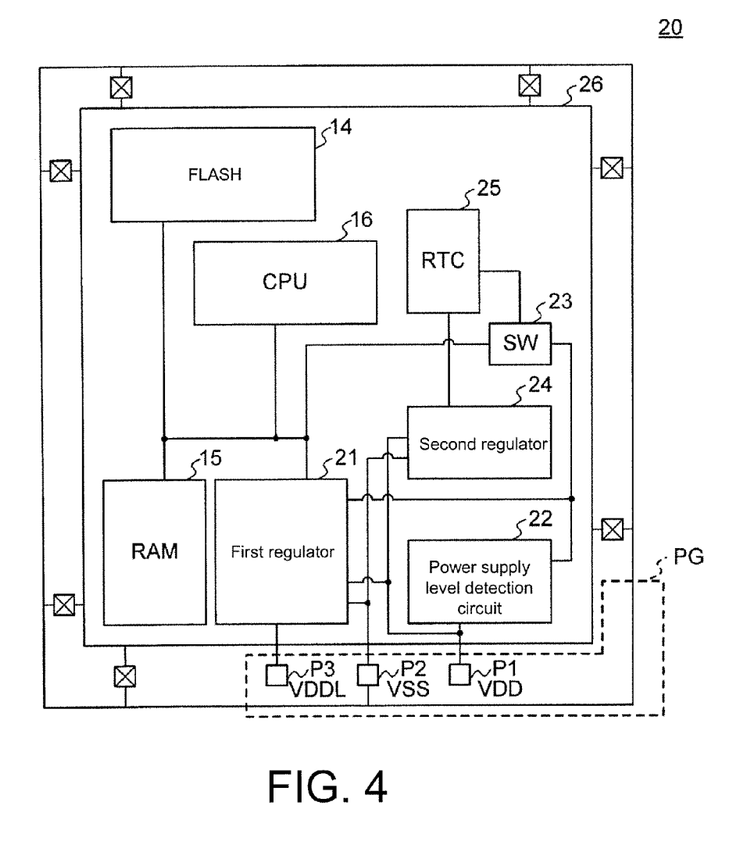
FIG. 4 schematically illustrates an upper surface of a semiconductor integrated circuit.

FIG. 4 schematically illustrates an upper surface of the semiconductor integrated circuit 20. The semiconductor integrated circuit 20 has a structure in which the blocks such as the first regulator 21 and so on are arranged on a main surface of a semiconductor substrate 26. In addition, a pad group PG including pads P1, P2 and P3 is provided on an outer edge portion of the semiconductor integrated circuit 20.

The pad P1 is a power supply pad to which the external power supply voltage VDD is inputted from outside of the semiconductor integrated circuit 20. The external power supply voltage VDD inputted through the pad P1 is supplied to the first regulator 21, the power supply level detection circuit 22 and the second regulator 24.

The pad P2 is a power supply pad connected to a ground potential VSS. The ground potential VSS inputted from the pad P2 is supplied to the first regulator 21 and the second regulator 24. In addition, a ground potential supply line extends from the pad P2 so as to go around the semiconductor substrate 26, and the ground potential supply line supplies the ground potential VSS to each part of the semiconductor integrated circuit 20.

The pad P3 is a connection pad for receiving an external power supply and connected to a phase compensation circuit (e.g., an externally attached capacitor) arranged outside the semiconductor integrated circuit 20. In order to make the processor circuit 18 operate stably, it is necessary to control a phase shift in the internal power supply voltage VDDL to be within a fixed range, and it is necessary to perform phase compensation on the internal power supply voltage VDDL supplied to the processor circuit 18. Hence, the phase compensation circuit is connected to the first regulator 21 from outside of the semiconductor integrated circuit 20 through the pad P3. Furthermore, the first regulator 21 is connected to the phase compensation circuit as short as possible so that a phase-compensated voltage is not affected by noise or the like. Accordingly, when viewed from a direction perpendicular to the main surface of the semiconductor substrate 26, i.e., in a top view, the first regulator 21 is arranged in the vicinity of the pad group PG.

By contrast, the RTC power supply voltage VDDR is a power supply voltage for making only the RTC circuit 25 operate, and therefore has a low demand for stable operation, unlike the internal power supply voltage VDDL.

Accordingly, since it does not need to connect to the phase compensation circuit from outside of the semiconductor integrated circuit 20, the second regulator 24 is arranged in a position farther than a position of the first regulator 21 from the pad group PG. Hence, according to the semiconductor integrated circuit of the present invention, since it is possible to design a layout without arranging both the first regulator 21 and the second regulator 24 in the vicinity of the pads, it is possible to provide a semiconductor integrated circuit having lower power consumption with high design freedom.

Figure 5:
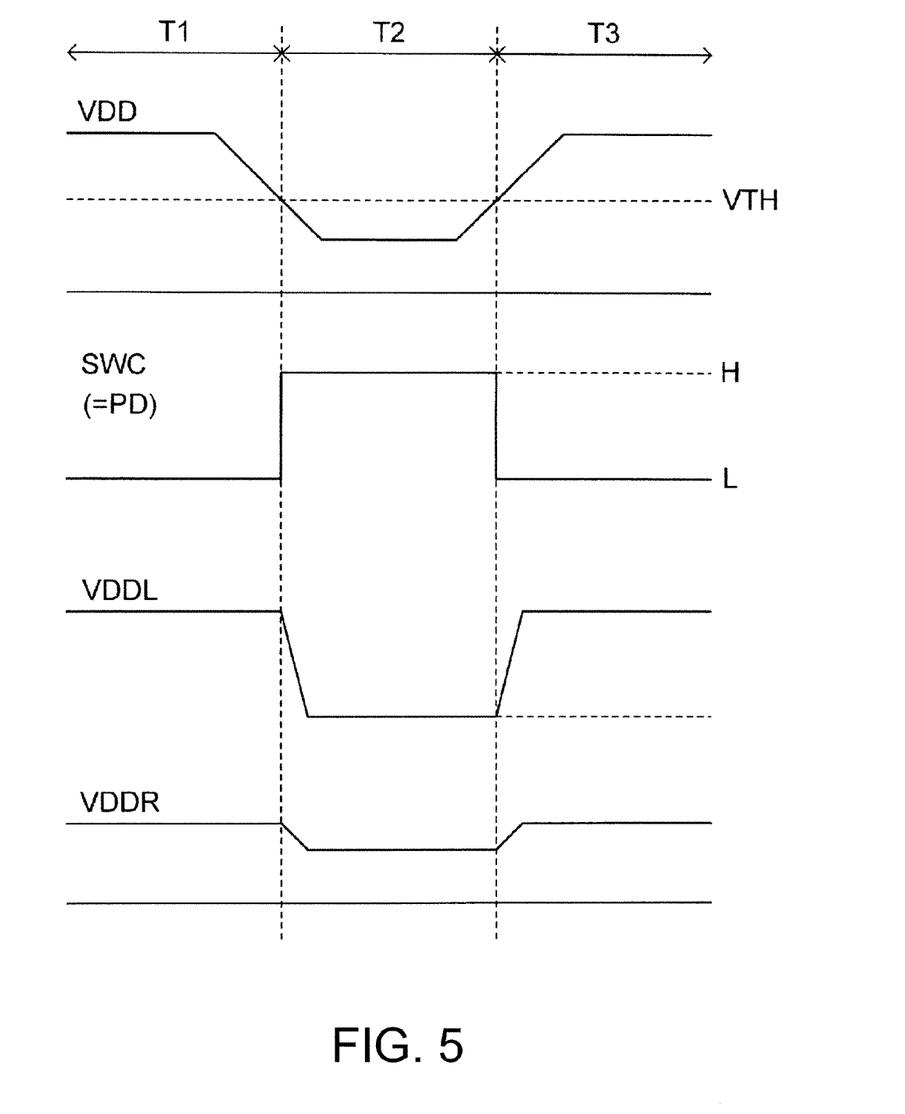
FIG. 5 is a time chart showing an external power supply voltage, an internal power supply voltage and a switch control signal.

Next, operation of the semiconductor integrated circuit 20 of the present embodiment is explained with reference to a time chart in FIG. 5.

When the external power supply voltage VDD exceeds the threshold voltage VTH (in the drawing, during a period T1), the power supply level detection circuit 22 supplies a low-level switching signal SWC to the changeover switch 23. In addition, the power supply level detection circuit 22 supplies a low-level power-down signal PD to the op-amp 21a of the first regulator 21.

Accordingly, the changeover switch 23 is controlled to be in the ON state, and the line L1 and the line L2 are maintained in the connected state. The op-amp 21a of the first regulator 21 steps down the external power supply voltage VDD to generate the internal power supply voltage VDDL, and supplies the internal power supply voltage VDDL to the processor circuit 18 (the flash memory 14, the RAM 15 and the CPU 16) and the RTC circuit 25 through the line L2.

The second regulator 24 generates the RTC power supply voltage VDDR and supplies the same to the RTC circuit 25. Accordingly, the internal power supply voltage VDDL is supplied to the RTC circuit 25 from the first regulator 21, and the RTC power supply voltage VDDR is supplied to the RTC circuit 25 from the second regulator 24. Since the voltage level of the internal power supply voltage VDDL is higher than that of the RTC power supply voltage VDDR, the RTC circuit 25 operates based on the internal power supply voltage VDDL.

Next, when the external power supply voltage VDD becomes equal to or less than the threshold voltage VTH (in the drawing, during a period T2), the power supply level detection circuit 22 detects this and supplies a high-level switching signal SWC to the changeover switch 23. Accordingly, the changeover switch 23 is controlled to be in the OFF state, and a non-connection state is achieved between the line L1 and the line L2.

In addition, the power supply level detection circuit 22 supplies a high-level power-down signal PD to the first regulator 21. Accordingly, the first regulator 21 is controlled to be in the power-off state, and stops the supply of the internal power supply voltage VDDL to the processor circuit 18 (the flash memory 14, the RAM 15 and the CPU 16).

The second regulator 24 supplies the RTC power supply voltage VDDR to the RTC circuit 25. As the voltage level of the external power supply voltage VDD is lowered, the voltage level of the RTC power supply voltage VDDR is also lowered. The RTC circuit 25 operates based on the RTC power supply voltage VDDR.

Then, when the external power supply voltage VDD again exceeds the threshold voltage VTH (in the drawing, during a period T3), the power supply level detection circuit 22 switches the signal levels of the switching signal SWC and the power-down signal PD to low level. The changeover switch 23 is controlled to be in the ON state, and the line L1 and the line L2 become in the connected state. The op-amp 21a of the first regulator 21 steps down the external power supply voltage VDD to generate the internal power supply voltage VDDL, and supplies the internal power supply voltage VDDL to the processor circuit 18 (the flash memory 14, the RAM 15 and the CPU 16) and the RTC circuit 25. The second regulator 24 generates the RTC power supply voltage VDDR and supplies the same to the RTC circuit 25.

As described above, in the semiconductor integrated circuit 20 of the present embodiment, when it is detected that the voltage level of the external power supply voltage VDD becomes equal to or lower than the threshold voltage VTH, the first regulator 21 is controlled to be in the power-off state, so as to stop the supply of power to the processor circuit 18. On the other hand, the second regulator 24 generates the RTC power supply voltage VDDR and continues to supply the same to the RTC circuit 25. Accordingly, it is possible to suppress power consumption while causing the RTC circuit 25 to operate.

In addition, in the operation (hereinafter referred to as normal operation) of the semiconductor integrated circuit 20 under the state in which the external power supply voltage VDD exceeds the threshold voltage VTH, the changeover switch 23 is controlled to be in the ON state, and the internal power supply voltage VDDL is supplied to the RTC circuit 25 through the changeover switch 23. Accordingly, in the changeover switch 23, a voltage drop occurs based on an on-resistance of the P-channel type MOS transistor constituting the changeover switch 23. However, in the semiconductor integrated circuit 20 of the present embodiment, since current consumption in the RTC circuit 25 is small, the amount of voltage drop that occurs is extremely small.

For example, in the semiconductor integrated circuit 10 of Embodiment 1, assuming that an on-resistance of the P-channel type MOS transistor constituting the changeover switch 13 is 5Ω, and current consumption in the processor circuit 18 (the flash memory 14, the RAM 15 and the CPU 16) is 20 mA, a voltage drop of 100 mV occurs in the changeover switch 13. By contrast, in the semiconductor integrated circuit 20 of the present embodiment, since the current consumption in the RTC circuit 25 has an extremely small value (e.g., about several μA), assuming that the on-resistance of the P-channel type MOS transistor constituting the changeover switch 23 is 5Ω, the amount of voltage drop occurring in the changeover switch 23 becomes several tens of μV.

In addition, according to the semiconductor integrated circuit 20 of the present embodiment, the influence of the voltage drop in the changeover switch 23 on operation of the circuit can be suppressed. For example, to suppress the amount of voltage drop in a transistor, it is effective to increase a size (such as gate width, etc.) of the transistor in order to reduce the on-resistance. However, in the present embodiment, since the amount of voltage drop in the changeover switch 23 is small as mentioned above, there is no need to increase the size of the P-channel type MOS transistor constituting the changeover switch 23. Accordingly, occurrence of an off-leak current in the changeover switch 23 can be suppressed.

Furthermore, unlike the semiconductor integrated circuit 10 of Embodiment 1, in the semiconductor integrated circuit 20 of the present embodiment, the supply of the internal power supply voltage VDDL to the processor circuit 18 (the flash memory 14, the RAM 15 and the CPU 16) is performed directly from the first regulator 21 without passing through a changeover switch or the like. Accordingly, since an output voltage of the first regulator 21 is supplied to the processor circuit 18 as it is without being stepped down, a malfunction due to voltage drop does not occur.

Moreover, the present invention is not limited to the above embodiments. For example, in the above Embodiment 2, an example has been explained in which the first regulator 21 is controlled to be power-off by cutting off the current path in the op-amp 21*a*. However, the method of controlling the first regulator 21 to be power-off is not limited to this. For example, a configuration may be adopted in which a changeover switch is provided for a line between the external power supply voltage VDD and the first regulator 21, and the first regulator 21 is controlled to be power-off by switching off the changeover switch based on the power-down signal PD.

In addition, examples have been explained in which the regulator 11 of Embodiment 1 and the first regulator 21 and the second regulator 24 of Embodiment 2 respectively step down the external power supply voltage VDD to generate the internal power supply voltage. However, the respective regulators may also generate the internal power supply voltage by stepping up rather than stepping down the external power supply voltage VDD. That is, the regulator 11, the first regulator 21 and the second regulator 24 may respectively transform the external power supply voltage to generate the internal power supply voltage.

In addition, in the above Embodiment 2, an example is shown in which the switching signal SWC is supplied as the power-down signal PD. However, the power-down signal PD may be a signal that transmits to binary value in response to detection by the power supply level detection circuit 22 and may be a signal different from the switching signal SWC.

In addition, in the above Embodiment 2, an example has been explained in which the pad group PG includes the pad P1 being the power supply pad to which the external power supply voltage VDD is inputted, the pad P2 being the power supply pad connected to the ground potential VSS, and the pad P3 being the connection pad for connecting the phase compensation circuit. However, the pads included in the pad group PG are not limited to these pads.

In addition, the position where the second regulator 24 is arranged is not limited to the position shown in FIG. 4. As mentioned above, since there is no need to connect the phase compensation circuit from the outside of the semiconductor integrated circuit 20 to the second regulator 24, there is no need to dispose the second regulator 24 close to the pad group. Accordingly, the second regulator 24 can be disposed at any arbitrary position on the semiconductor substrate 26.

In the present application, no power supply method claim is claimed. However, the following claim may be claimed in a separate application.

A power supply switching method in a semiconductor integrated circuit, the semiconductor integrated circuit comprising: a regulator generating an internal power supply voltage by transforming an external power supply voltage; a processor circuit operating itself by being supplied with the internal power supply voltage; an RTC circuit generate a current time data by being supplied with the internal power supply voltage; a supply line supplying the internal power supply voltage to the RTC circuit and to the processor circuit; and a changeover switch provided between the supply line and the processor circuit and switching between a connection state and a non-connection state between the supply line and the processor circuit, wherein the power supply switching method comprises:

a step of detecting a voltage level of the external power supply voltage; and a step of controlling the changeover switch to achieve the non-connection state between the supply line and the processor circuit if detecting that the voltage level is equal to or lower than a predetermined threshold.

As another example, a power supply switching method in a semiconductor integrated circuit, the semiconductor integrated circuit comprising: a first regulator generating a first internal power supply voltage by transforming an external power supply voltage; a second regulator generating a second internal power supply voltage by transforming the external power supply voltage; a processor circuit operating itself by being supplied with the first internal power supply voltage; an RTC circuit generating a current time data by being supplied with the first internal power supply voltage and the second internal power supply voltage; a first supply line supplying the first internal power supply voltage to the processor circuit; a second supply line supplying the second internal power supply voltage to the RTC circuit; and a changeover switch provided between the first supply line and the second supply line and switching between a connection state and a non-connection state between the first supply line and the second supply line, wherein the power supply switching method comprises:

a step of detecting a voltage level of the external power supply voltage; and a step of stopping operation of the first regulator and controlling the changeover switch to achieve the non-connection state between the first supply line and the second supply line if detecting that the voltage level is equal to or lower than a predetermined threshold.

What is claimed is:

1. A semiconductor integrated circuit, comprising:
a regulator for generating an internal power supply voltage by transforming an external power supply voltage;
a processor circuit configured to operate itself by being supplied with the internal power supply voltage;
a real time clock (RTC) circuit for generating a current time data by being supplied with the internal power supply voltage;
a supply line supplying the internal power supply voltage to the RTC circuit and to the processor circuit;
a changeover switch provided between the supply line and the processor circuit and switching between a connection state and a non-connection state between the supply line and the processor circuit; and
a power supply level detection circuit detecting a voltage level of the external power supply voltage and controlling the changeover switch to achieve the non-connection state between the supply line and the processor circuit if detecting that the voltage level is equal to or lower than a predetermined threshold.

2. A semiconductor integrated circuit, comprising:
a first regulator for generating a first internal power supply voltage by transforming an external power supply voltage;
a second regulator for generating a second internal power supply voltage by transforming the external power supply voltage;
a processor circuit configured to operate itself by being supplied with the first internal power supply voltage;
an RTC circuit for generating a current time data by being supplied with the first internal power supply voltage and the second internal power supply voltage;
a first supply line supplying the first internal power supply voltage to the processor circuit;
a second supply line supplying the second internal power supply voltage to the RTC circuit;

a changeover switch provided between the first supply line and the second supply line and switching between a connection state and a non-connection state between the first supply line and the second supply line; and a power supply level detection circuit detecting a voltage level of the external power supply voltage, and stopping operation of the first regulator and controlling the changeover switch to achieve the non-connection state between the first supply line and the second supply line if detecting that the voltage level is equal to or lower than a predetermined threshold.

3. The semiconductor integrated circuit according to claim 2, wherein the first regulator, the second regulator, the processor circuit, the RTC circuit, the first supply line, the second supply line, the changeover switch and the power supply level detection circuit are formed on a main surface of a semiconductor substrate, and a connection pad connected to the first regulator is provided on an outer edge portion of the semiconductor substrate.

4. The semiconductor integrated circuit according to claim 3, comprising:

a pad group comprising a first power supply pad that receives an input of the external power supply voltage and a second power supply pad that is connected to a ground potential on the outer edge portion of the semiconductor substrate, wherein the first regulator is arranged in a vicinity of the pad group; and the second regulator is arranged in a position farther than a position of the first regulator from the pad group.

5. A power supply switching method in a semiconductor integrated circuit, the semiconductor integrated circuit comprising: a regulator for generating an internal power supply voltage by transforming an external power supply voltage; a processor circuit configured to operate itself by being supplied with the internal power supply voltage; an RTC circuit for generating a current time data by being supplied with the internal power supply voltage; a supply line supplying the internal power supply voltage to the RTC circuit and to the processor circuit; and a changeover switch provided between the supply line and the processor circuit and switching between a connection state and a non-connection state between the supply line and the processor circuit, wherein the power supply switching method comprises:

a step of detecting a voltage level of the external power supply voltage; and a step of controlling the changeover switch to achieve the non-connection state between the supply line and the processor circuit if detecting that the voltage level is equal to or lower than a predetermined threshold.

* * * * *